US006949911B2

(12) United States Patent
Laig-Hoerstebrock et al.

(10) Patent No.: US 6,949,911 B2
(45) Date of Patent: Sep. 27, 2005

(54) METHOD FOR DETERMINING THE AMOUNT OF CHARGE WHICH CAN BE DRAWN FROM A STORAGE BATTERY AND A MONITORING DEVICE FOR A STORAGE BATTERY

(75) Inventors: Helmut Laig-Hoerstebrock, Frankfurt (DE); Eberhard Meissner, Wunstorf (DE)

(73) Assignee: VB Autobatterie GmbH, Hannover (DE)

( * ) Notice: Subject to any disclaimer, the term of this patent is extended or adjusted under 35 U.S.C. 154(b) by 234 days.

(21) Appl. No.: 10/639,329

(22) Filed: Aug. 12, 2003

(65) Prior Publication Data

US 2004/0095143 A1 May 20, 2004

(30) Foreign Application Priority Data

Aug. 13, 2002 (DE) ......................................... 102 36 958

(51) Int. Cl.$^7$ ........................ H01M 10/44; H01M 10/46
(52) U.S. Cl. ..................................................... 320/132
(58) Field of Search ................................ 320/132, 149; 324/426, 427, 430, 433

(56) References Cited

U.S. PATENT DOCUMENTS

| | | | |
|---|---|---|---|
| 3,906,329 A | 9/1975 | Bader | |
| 4,153,867 A | 5/1979 | Jungfer, deceased et al. | |
| 4,193,025 A | 3/1980 | Frailing et al. | |
| 4,207,611 A | 6/1980 | Gordon | |
| 4,322,685 A | 3/1982 | Frailing et al. | |
| 4,595,880 A | 6/1986 | Patil | |
| 4,642,600 A | 2/1987 | Gummelt et al. | |
| 4,659,977 A | 4/1987 | Kissel et al. | |
| 4,665,370 A | 5/1987 | Holland | |
| 4,719,427 A | 1/1988 | Morishita et al. | |
| 4,816,736 A | 3/1989 | Dougherty et al. | |
| 4,876,513 A | 10/1989 | Brilmyer et al. | |
| 4,888,716 A | 12/1989 | Ueno | |
| 4,937,528 A | 6/1990 | Palanisamy | |
| 4,943,777 A | 7/1990 | Nakamura et al. | |
| 4,952,861 A | 8/1990 | Horn | |
| 5,002,840 A | 3/1991 | Klebenow et al. | |
| 5,032,825 A | 7/1991 | Kuznicki | |
| 5,055,656 A | 10/1991 | Farah et al. | |
| 5,079,716 A | 1/1992 | Lenhardt et al. | |
| 5,130,699 A | 7/1992 | Reher et al. | |
| 5,159,272 A | 10/1992 | Rao et al. | |
| 5,162,164 A | 11/1992 | Dougherty et al. | |
| 5,204,610 A | 4/1993 | Pierson et al. | |
| 5,223,351 A | 6/1993 | Wruck | |
| 5,280,231 A | 1/1994 | Kato et al. | |
| 5,281,919 A | 1/1994 | Palanisamy | |
| 5,316,868 A | 5/1994 | Dougherty et al. | |
| 5,321,627 A | 6/1994 | Reher | |
| 5,352,968 A | 10/1994 | Reni et al. | |
| 5,381,096 A | 1/1995 | Hirzel | |
| 5,404,129 A | 4/1995 | Novak et al. | |
| 5,412,323 A | 5/1995 | Kato et al. | |
| 5,416,402 A | 5/1995 | Reher et al. | |
| 5,428,560 A | 6/1995 | Leon et al. | |
| 5,439,577 A | 8/1995 | Weres et al. | |
| 5,488,283 A | 1/1996 | Dougherty et al. | |
| 5,549,984 A | 8/1996 | Dougherty | |
| 5,552,642 A | 9/1996 | Dougherty et al. | |
| 5,563,496 A | 10/1996 | McClure | |
| 5,572,136 A | 11/1996 | Champlin | |
| 5,578,915 A | 11/1996 | Crouch, Jr. et al. | |
| 5,656,915 A | 8/1997 | Eaves | |
| 5,680,050 A | 10/1997 | Kawai et al. | |
| 5,698,965 A | 12/1997 | York | |
| 5,721,688 A | 2/1998 | Bramwell | |
| 5,744,936 A | 4/1998 | Kawakami | |
| 5,744,963 A | 4/1998 | Arai et al. | |
| 5,761,072 A | 6/1998 | Bardsley, Jr. et al. | |
| 5,773,977 A | 6/1998 | Dougherty | |
| 5,808,367 A | 9/1998 | Akagi et al. | |
| 5,808,445 A | 9/1998 | Aylor et al. | |
| 5,818,116 A | 10/1998 | Nakae et al. | |
| 5,818,333 A | 10/1998 | Yaffe et al. | |
| 5,847,566 A | * 12/1998 | Marritt et al. | ............... 324/427 |
| 5,896,023 A | 4/1999 | Richter | |
| 5,898,292 A | 4/1999 | Takemoto et al. | |
| 5,936,383 A | 8/1999 | Ng et al. | |
| 5,965,954 A | 10/1999 | Johnson et al. | |
| 5,977,654 A | 11/1999 | Johnson et al. | |
| 5,990,660 A | 11/1999 | Meissner | |
| 6,016,047 A | 1/2000 | Notten et al. | |
| 6,037,749 A | 3/2000 | Parsonage | |
| 6,037,777 A | 3/2000 | Champlin | |

(Continued)

FOREIGN PATENT DOCUMENTS

| | | |
|---|---|---|
| DE | 22 42 410 | 3/1973 |
| DE | 2 242 510 C3 | 4/1974 |

(Continued)

OTHER PUBLICATIONS

Intelec '88—Tenth International communications Energy Conference, "A look at the Impedance of a Cell—S.L. DeBardelaben, New York Telephone Company," bearing a designation "Oct. 30–Nov. 2, 1988." (6 sheets).

(Continued)

Primary Examiner—Edward H. Tso
(74) Attorney, Agent, or Firm—Foley & Lardner LLP

(57) ABSTRACT

A method for determining the amount of charge which can be drawn from a storage battery includes determining a response signal profile within a time interval to an electrical stimulus to the storage battery. The method also includes linearizing the response signal profile and determining the amount of charge which can be drawn as a function of a degree of change of the linearized response signal profile in the time interval. A monitoring device for a storage battery is provided that includes measurement means for measuring at least one of voltage and current of the storage battery over time intervals. The monitoring device also includes evaluations means that are designed for carrying out the method.

42 Claims, 2 Drawing Sheets

U.S. PATENT DOCUMENTS

| | | | |
|---|---|---|---|
| 6,057,666 | A | 5/2000 | Dougherty et al. |
| 6,087,808 | A | 7/2000 | Pritchard |
| 6,091,325 | A | 7/2000 | Zur et al. |
| 6,118,252 | A | 9/2000 | Richter |
| 6,118,275 | A | 9/2000 | Yoon et al. |
| 6,144,185 | A | 11/2000 | Dougherty et al. |
| 6,160,382 | A | 12/2000 | Yoon et al. |
| 6,222,341 | B1 | 4/2001 | Dougherty et al. |
| 6,268,712 | B1 | 7/2001 | Laig-Horstebrock et al. |
| 6,271,642 | B1 | 8/2001 | Dougherty et al. |
| 6,296,593 | B1 | 10/2001 | Gotou et al. |
| 6,300,763 | B1 | 10/2001 | Kwok |
| 6,304,059 | B1 | 10/2001 | Chalasani et al. |
| 6,331,762 | B1 | 12/2001 | Bertness |
| 6,369,578 | B1 | 4/2002 | Crouch, Jr. et al. |
| 6,388,421 | B2 | 5/2002 | Abe |
| 6,388,450 | B2 | 5/2002 | Richter et al. |
| 6,392,389 | B1 | 5/2002 | Kohler |
| 6,392,414 | B2 | 5/2002 | Bertness |
| 6,392,415 | B2 | 5/2002 | Laig-Horstebrock et al. |
| 6,417,668 | B1 | 7/2002 | Howard et al. |
| 6,424,157 | B1 | 7/2002 | Gollomp et al. |
| 6,441,585 | B1 | 8/2002 | Bertness |
| 6,441,586 | B1 * | 8/2002 | Tate et al. .................. 320/132 |
| 6,445,158 | B1 | 9/2002 | Bertness et al. |
| 6,452,361 | B2 | 9/2002 | Dougherty et al. |
| 6,472,875 | B1 | 10/2002 | Meyer |
| 6,495,990 | B2 | 12/2002 | Champlin |
| 6,507,194 | B2 | 1/2003 | Suzuki |
| 6,515,452 | B2 | 2/2003 | Choo |
| 6,515,456 | B1 | 2/2003 | Mixon |
| 6,522,148 | B2 | 2/2003 | Ochiai et al. |
| 6,534,992 | B2 | 3/2003 | Meissner et al. |
| 6,556,019 | B2 | 4/2003 | Bertness |
| 6,600,237 | B1 | 7/2003 | Meissner |
| 6,600,293 | B2 | 7/2003 | Kikuchi |
| 6,608,482 | B2 | 8/2003 | Sakai et al. |
| 6,653,818 | B2 | 11/2003 | Laig-Horstebrock et al. |
| 2002/0008495 | A1 | 1/2002 | Dougherty et al. |
| 2002/0026252 | A1 | 2/2002 | Wruck et al. |
| 2002/0031700 | A1 | 3/2002 | Wruck et al. |
| 2003/0047366 | A1 | 3/2003 | Andrew et al. |
| 2003/0082440 | A1 | 5/2003 | Mrotek et al. |
| 2003/0142228 | A1 | 7/2003 | Flach et al. |
| 2003/0236656 | A1 | 12/2003 | Dougherty |
| 2004/0021468 | A1 | 2/2004 | Dougherty et al. |

FOREIGN PATENT DOCUMENTS

| | | |
|---|---|---|
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 10/1997 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Battery Alert, Ltd., "The Easy–to–Install Battery Deterioration Warning Device", 12 Volt Model (BA101) Advertisement (2 sheets), no date.

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Battery Evaluation Reports, s.e. Ross Laboratories, Inc., Apr. 1999 (1 page).

HSR–003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Reed Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pp. http://www.cotorelay.com/ReedTech.pdf, available at least by Jan. 6, 2003, 37–43.

Willibert Schleuter, *Das elektrische Ersatzschaltbild des Bleiakkumulators unter Berücksichtigung erzwungener Elektrolytströmung*, etz Archiv, vol. 4 (1982), Issue 7, pp. 213–218.

Lürkens et al., *Ladezustandsschätzuntt von Bleibatterien mit Hilfe des Kalman–Filters*, etz Archiv, vol. 8 (1986), Issue 7, pp. 231–236.

Brooke, L., "Resin Keeps Batteries Cool", A1 Inside Magazine, Nov., 1998, p. 55.

Hoover, J., "Failure Modes of Batteries Removed from Service", A Presentation at the 107th Convention of Battery Council International, Apr. 30–May 3, 1995, p. 62.

Stan Gibilisco and Neil Sclater, Co–Editors–in–Chief, "Rectifier Bridge," Encyclopedia of Electronics, 2nd Edition, TAB Professional and Reference Books, 1996, pp. 708–711.

Lehman, A., "Electrical Battery Model For Leo Application Based on Absolute Instantaneous State of Charge," Proceedings of the European Space Power Conference held in Madrid, Spain, Oct. 2–6, 1989, ESA Publications, NL, vol. 1, pp. 173–178.

Robbins, Tim & Hawkins, John, "Battery Model For Over–Current Protection Simulation of DC Distribution Systems," Telecommunications Energy Conference, 1994, Intelec '94, 16th International Vancouver, BC, Canada Oct. 30–Nov. 3, 1994, New York, NY, IEEE, pp. 307–314 XP001036407 ISBN: 0–7803–2034–4.

Mayer, D. et al., "Modelling and Analysis of Lead Acid Battery Operation," Ecole des Mines de Paris, XP010092137, pp. 1–3, no date.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., Vol. 67 (1997) No. 1–2, pp. 69–84, XP004095174 ISSN: 0378–7753, p. 70, line 11; p. 82, line 5, figures 2, 3, 12.

Baert, D & Vervaet, A., "Lead–Acid Battery Model for the Derivation of Peukert's Law," Electrochimica Acta, Elsevier Science Publishers, Barking, GB, vol. 44, No. 20, pp. 3491–3504 XP004168624 ISSN: 0013–4686, no date.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19–22, 1986." (6 sheets).

Bosch and the New E–Class, Electronic Battery Management System, Focus on Electronics, Nov. 2002 (1 sheet).

Forecast Review, The Battery Man, Nov., 1996 p. 21.

OnGuard™ XT Battery State–of–Health Monitor, 2003 Midtronics, Inc. P/N 156–983A (2 sheets).

* cited by examiner

METHOD FOR DETERMINING THE AMOUNT OF CHARGE WHICH CAN BE DRAWN FROM A STORAGE BATTERY AND A MONITORING DEVICE FOR A STORAGE BATTERY

CROSS-REFERENCE TO RELATED PATENT APPLICATIONS

Germany Priority Application DE 102 36 958.5, filed Aug. 13, 2002, including the specification, drawings, claims and abstract, is incorporated herein by reference in its entirety.

BACKGROUND

The present invention relates to a method for determining the amount of charge which can be drawn from a storage battery. The present invention also relates to a monitoring device for a storage battery having measurement means for measurement of the battery voltage and/or battery currents, and also having evaluation means.

The use of rechargeable storage batteries, in particular when they are being discharged and charged, results in wear. In addition, other operating conditions also exist which speed up the wear to electrochemical energy stores. In the case of a lead-acid rechargeable battery, for example, these include the overall operating life (i.e., the entire time which has passed since the battery was first brought into use, including the periods in which the battery had no electrical load applied to it).

This wear is further exacerbated by increased temperatures. Increased temperatures may, however, not only speed up the wear during periods in which no electrical load is applied, but also may exacerbate the wear caused by cyclic discharging and charging operations.

In the case of a storage battery, the wear is expressed, inter alia, by a reduction in the storage capacity for electrical charge, so that the amount of charge that can be drawn starting from the full state of charge cannot easily be determined.

The amount of charge $Q_R$ which can be drawn from the storage battery is in this case the amount of charge which can still be drawn in nominal conditions, starting from the present state of the storage battery. When the storage battery is in the new state, the sum of the amount of charge which can be drawn and the amount of charge which has been discharged is the storage capacity in the new state.

The storage capacity in the new state is the actual storage capacity of a new, unused energy store.

The amount of charge discharged is the amount of charge which must be drawn in nominal conditions from a storage battery starting from the fully charged state, in order to reach the present state of charge.

The present storage capacity is the amount of charge expressed in amp-hours (Ah) which can be drawn in nominal conditions from a correctly fully charged energy store. This variable changes with the time during which the storage battery has been in use, generally with a falling tendency.

The nominal storage capacity is defined as the nominal value of the storage capacity as stated by the manufacturer of the storage battery. The reduction in the storage capacity is regarded as the difference between the present storage capacity and the storage capacity in the new state.

In this context, U.S. Pat. No. 5,761,072 describes a method for determining the capacity of a storage battery, in which a fast current is determined by means of a filter and a slow current is determined by averaging by means of integration. The values for the fast current and slow current are used in what is referred to as a Peukert relationship in order to determine the capacity for a fast current and for a slow current. These capacities are weighted, and an overall capacity is calculated from them.

DE 93 21 638 describes an electronic battery tester for testing an electrochemical cell or battery, which has a dynamic parameter, such as a conductance value or a resistance. The battery tester has a device for measurement of this dynamic parameter, for measurement of the no-load voltage and for correction of the measured dynamic parameter value with respect to the state of charge, by matching the no-load voltage.

U.S. Pat. No. 5,680,050 discloses a method for battery state identification, in which a correction value is determined on the basis of an average discharge, for a time period which is longer than the time period which changes the discharge polarization to a steady state. The capacity of the battery in the fully charged state is multiplied by this correction value, and the energy consumption of the battery is subtracted from the available discharge capacity in order to determine the available spare capacity.

The above-mentioned methods and apparatuses determine present electrical characteristic values for a storage battery in terms of a conductance value or internal resistance or determine the discharge capacity which can be drawn from a storage battery as a function of discharge current, although this has the disadvantage that the capacity of the fully charged storage battery must be known.

DE 691 31 276 T2 discloses an electronic tester for assessment of the percentage energy capacity of a storage battery or a battery cell. In this method, the dynamic conductance value is determined and is related to a reference conductance value which corresponds to the dynamic conductance value of a battery or battery cell with 100% capacity. However, this tester cannot be used to determine the total capacity of a fully charged storage battery or to distinguish whether any change has taken place in the capacity due to aging or due to normal discharging. It is not yet possible to use the time response of the measurement values over a lengthy period of time to obtain information relating to the state of wear of the storage battery. Furthermore, the dynamic conductance value is only of limited use as a measure for battery wear.

EP 0 516 336 B1 discloses a method for determining the amount of charge which can be drawn and the remaining capacity of a storage battery, in which the imaginary part of a response signal profile in the impedance spectra domain is regarded as a function of the root of a sinusoidal stimulus frequency. This is extrapolated to the point at which the response signal profile in the impedance spectra domain intersects the imaginary axis. The remaining capacity is deduced from the extrapolated value that is obtained from this. In this case, a search is carried out for the radio-frequency intersection of a Warburg straight line, and this is used as a measure for the amount of charge which can be drawn.

There is thus a need to estimate the amount of charge which can be drawn from a storage battery during operation. There is also a need to provide an improved method for determining the amount of charge which can still be drawn from a storage battery when the storage battery is no longer in the new state. There is also a need for a monitoring device which has measurement means and evaluation means (e.g., in the form of a program which can be run on a processor) designed for carrying out the method.

SUMMARY

An exemplary embodiment of the invention relates to a method for determining the amount of charge which can be drawn from a storage battery. The method includes determining a response signal profile within a time interval to an electrical stimulus to the storage battery. The method also includes linearizing the response signal profile and determining the amount of charge which can be drawn as a function of a degree of change of the linearized response signal profile in the time interval.

Another exemplary embodiment relates to a monitoring device for a storage battery. The monitoring device includes measurement means for measuring at least one of voltage and current of the storage battery over time intervals. The monitoring device also includes evaluations means that are designed for carrying out a method that includes determining a response signal profile within a time interval to an electrical stimulus to the storage battery. The method also includes linearizing the response signal profile and determining the amount of charge which can be drawn as a function of a degree of change of the linearized response signal profile in the time interval.

BRIEF DESCRIPTION OF THE DRAWINGS

The invention will be explained in more detail in the following text with reference to the attached drawings, in which.

DETAILED DESCRIPTION OF THE PREFERRED AND EXEMPLARY EMBODIMENTS

Figure 1:
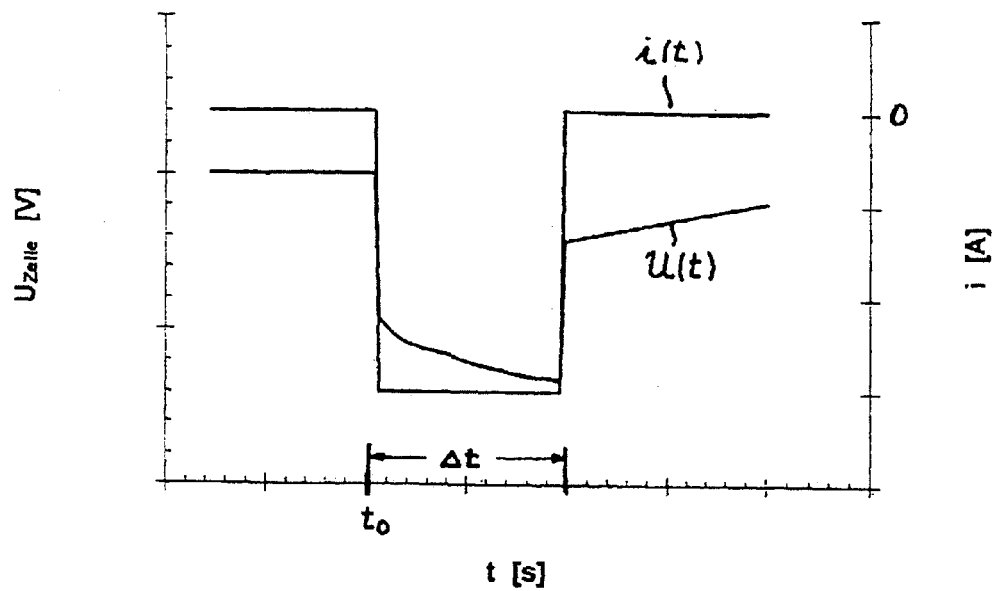
FIG. 1 shows a diagram of the voltage profile of a storage battery when a current pulse is applied.

According to an exemplary embodiment, a method for determining the amount of charge which can be drawn from a storage battery includes determining a response signal profile within a time interval to an electrical stimulus to the storage battery; linearizing the response signal profile; and determining the amount of charge which can be drawn as a function of the degree of change to the linearized response signal profile in the time interval.

It has been found that the amount of charge which can be drawn can be determined from a response signal to a stimulus to the storage battery if the response signal is linearized. In this case, surprisingly, it has been found that the degree of change in a linearized response signal profile such as this can be used directly as a measure for the amount of charge which can be drawn.

A stimulus such as this may comprise, for example, the application of current pulses and/or voltage pulses. Response signal profiles to stimuli can equally well be used to determine the amount of charge which can be drawn during operation with a suitable load applied to the storage battery.

The method now makes it possible in a simple manner to monitor a storage battery and to determine the amount of charge which can be drawn, since all that is necessary is to record response signal profiles and to evaluate them mathematically.

The response signal profile is preferably a voltage response to a pulsed current stimulus to the storage battery, but may also be a current response to pulsed voltage excitation.

The degree of change is preferably obtained by determining the gradient of a linear regression line through the linearized response signal profile. A linear regression line such as this can be determined in a simple manner for a sequence of measurement values in the time intervals under consideration.

Using the gradient, the amount of charge which can be drawn is preferably inversely proportional to the gradient of the linear regression lines, although it is also possible to take into account a proportionality factor which, for example, is the energy storage capacity $K_{new}$ of the storage battery in the new state.

For linearization of the response signal profile, it is particularly advantageous to regard the response signal profile as a function of the square root of the time difference between the start time of the time interval under consideration and the time.

It is also advantageous to improve the measurement accuracy by applying a sequence of current pulses or voltage pulses as a stimulus to the storage battery, with the degrees of change for the response signal profiles to the individual current pulses or voltage pulses and the amount of charge which can be drawn being determined as a function of the averaged degrees of change.

Current pulses of the same amplitude are not always available. If it is intended to use natural current pulses which, for example, occur during phases when a motor vehicle is at rest and which are not always of the same magnitude, the degree of change is preferably related to the magnitude of the sudden current change in the current stimulus. Conversely, when a voltage pulse is applied to the storage battery, it is also recommended that the degree of change be related to the magnitude of the sudden voltage change.

In the case of multiple pulses, an evaluation can be carried out if the degree of change or the gradient of the linear regression line is related to the current different resulting from the change in the current values of current pulses, or is related to the voltage difference resulting from the change in the voltage values of voltage pulses.

It is particularly advantageous to repeatedly determine the degrees of change of the linearized response signal profiles during the time in which the storage battery is in use, and to use the relative change in the degrees of change to determine the relative change in the amount of charge which can be drawn. The relative change in the amount of charge which can be drawn may then be a measure of the wear to the storage battery.

It is also advantageous to relate the degree of change to a degree of change characteristic value which is characteristic of the storage battery in the new state, and to determine the amount of charge that can be drawn from the quotient. In this case, the amount of charge which can be drawn can be determined as a function of the present energy storage capacity, which is proportional to the ratio of the characteristic degree of change characteristic value in the new state of the storage battery to a determined gradient of a linearized response signal profile. The characteristic degree of change characteristic value for a new storage battery can be learnt in a defined operating time period or a time period after initial use, by repeatedly determining the degrees of change in this defined time using the method described above.

The present energy storage capacity is preferably determined using the formula $$K=K_{new}*S_{new}/S$$

where $K_{new}$ is the storage capacity of the storage battery in the new state, $S_{new}$ is the characteristic degree of change characteristic value and S is the present degree of change.

Alternatively, more complicated relationships for the present energy storage capacity can be provided using the formula:

$$K=K_{new} \times f(S, S_{new})$$

where the present energy storage capacity is determined, for example, using the formula:

$$K = K_{new} \frac{\left(\frac{a}{S-b}\right)}{\left(\frac{c}{S_{new}-d}\right)}$$

where a, b, c and d are constants.

The degrees of change are also preferably determined using comparable states of charge and temperatures of the storage battery, so that these boundary conditions are similar for different successive measurements.

The amount of charge which can be drawn is also preferably determined from the degree of change by means of a function or value table, in which case it is also possible to provide a dependency on the temperature of the storage battery. In this case, the degrees of change are preferably normalized with respect to a nominal temperature.

The storage battery is preferably stimulated using a current value magnitude for the current stimulus which corresponds at most to the 10-hour current, preferably at most to the 50-hour current, and particularly preferably at most to the 200-hour current.

It is also advantageous for a change in the current for the current stimulus to be carried out with a current rate of change whose magnitude is at least in the same order of magnitude as the quotient of the 5000-hour current per second, preferably at least in the same order of magnitude as the quotient of the 1000-hour current per second, and particularly preferably at least in the same order of magnitude as the quotient of the 200-hour current per second.

In order to determine the degree of change, it is advantageous to use only that section of the response signal profile which was measured at the earliest one second after the stimulus, preferably at the earliest 10 seconds after the stimulus, and at the latest 1000 seconds after the stimulus, and preferably at the latest 100 seconds after the stimulus. Furthermore, the only values of the evaluation signal profile which should be used for linearization are those which satisfy a defined determination measure (R factor) and which are thus suitable for matching to a linear relationship.

It is particularly advantageous for the determined amount of charge which can be drawn to be linked to a present degree of discharge and/or to a present state of charge, in order to determine the amount of charge with which the storage battery can be charged. Furthermore, the determined amount of charge that can be drawn, the degree of change, the amount of charge with which the storage battery can be charged at and/or the energy storage capacity of the storage battery can be compared as a comparison variable with a defined threshold value with the discrepancy or the ratio of the comparison variable to the threshold value being output and, if required, being used for further processing or being displayed. The threshold value is preferably chosen to be temperature-dependent.

A measure for a reduction in the storage capacity can preferably be determined by determining the present storage capacity of the storage battery from the determined amount of charge which can be drawn and by linking the present storage capacity to the storage capacity of the storage battery in the new state. The determined measure for the reduction in the storage battery is then preferably compared with a defined threshold value.

FIG. 1 shows a diagram of a voltage response signal profile as a function of the time t to a square-wave current pulse i(t) which has been applied to a storage battery. The start time $t_0$ of the square-wave current pulse i(t) defines the time interval Δt under consideration until the response signal U(t) decays.

According to an exemplary embodiment, the magnitude of the applied current pulse i(t) is relatively small (e.g., less than the 10-hour current of the storage battery).

Figure 2:
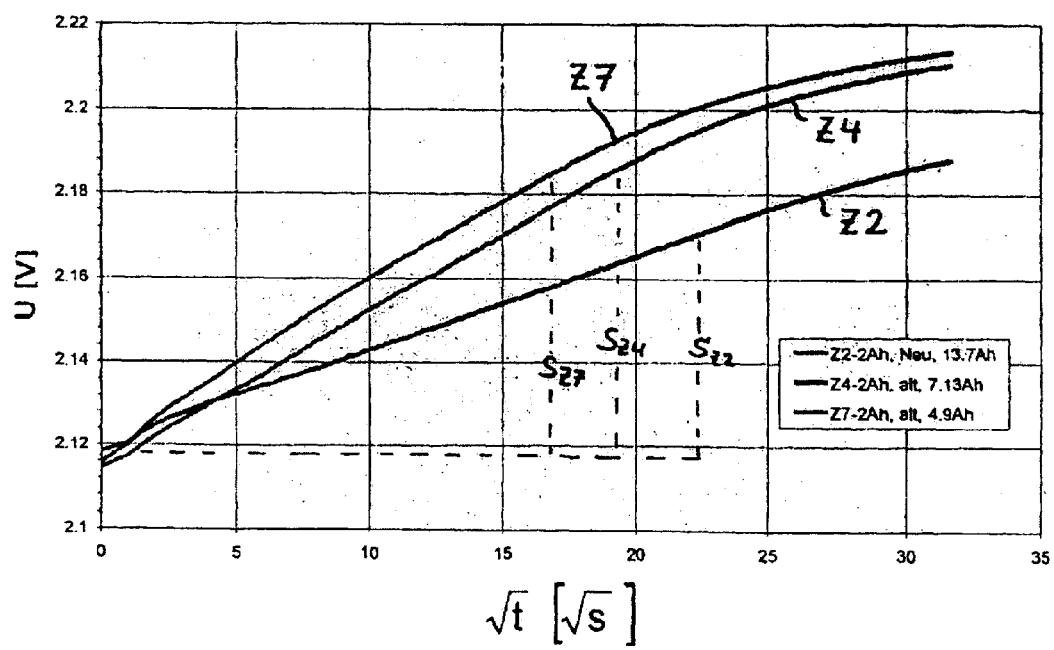
FIG. 2 shows a diagram of linearized response signal profiles for batteries with different storage capacities.

The measurement values of the response signal profile U(t) in the time interval under consideration Δt are then linearized, as is sketched by way of example in FIG. 2, by being plotted against the square root of the time difference $$\Delta t=t-t_0(U=f(\sqrt{t-t_0}))$$

However, it is also feasible to use other linearization methods.

A linear regression line is placed through the pairs of measurement values of a response signal profile which has been linearized in this way, using known regression methods, and the gradient of this straight line is determined as the degree of change S. The degree of change S is a characteristic value for the amount of charge $Q_R$ which can still be drawn from the storage battery at that time.

The time interval Δt under consideration is preferably chosen such that the time interval Δt=t–$t_0$ is greater than 1 second, and preferably greater than 10 seconds. The time interval Δt is also chosen such that it but is not longer than 1000 seconds, and preferably not longer than 200 seconds.

If the degree of change S is measured with the storage battery in the fully charged state, the degree of change S is a characteristic value of the present storage capacity, that is to say, of the amount in amp-hours (Ah) which can be drawn in nominal conditions from a correctly fully charged storage battery.

The gradient or the degree of change S behaves in the opposite sense, for example, being inversely proportional, to the present amount of charge $Q_R$ which can still be drawn, and thus rises as the storage capacity decreases with the time during which the storage battery has been used. The degree of change S is thus also a measure of the wear to the storage battery, and to the loss of storage capacity.

This relationship can be seen clearly in FIG. 2, which shows three linearized response signal profiles for three storage batteries with a different degree of aging. The response signal profile Z2 with the shallowest gradient $S_{z2}$ was measured with a new storage battery with an available storage capacity of 13.7 Ah. The response signal profile Z4 was measured with an elderly storage battery having a storage capacity still available of 7.13 Ah, and has a steeper gradient $S_{Z4}$ than the response signal profile of $S_{z2}$ a new storage battery. As can be seen, the response signal profile Z7 has an even steeper gradient $S_{Z7}$ than the previous two response signal profiles Z2, Z4. This response signal profile Z7 was measured with an elderly storage battery with an available storage capacity of 4.9 Ah.

The storage battery to be investigated can equally well have not only a single current pulse i(t) applied to it, but also a sequence of square-wave current pulses i(t) of the same or a different current level. Once again, the voltage response U(t) to the current pulses i(t) is recorded as a function of time t for each current pulse i(t). The time t starting from the instant of the respective current pulse when the start time is $t_0$ is likewise recorded, and the measurement values of the voltage response to the current pulses i(t) are plotted as a function of the time U(t) for each current pulse against the square root of the time difference $\Delta t = t - t_0$. In this case, as described above, a straight line is in each case determined using regression methods, and the gradient $S_1$ of the straight lines is determined. The degree of change S is determined from the averaged gradients $S_1$, and this is used to determine the amount of charge $Q_R$ which can still be drawn, and the loss of storage capacity. The degree of change S may in this case be calculated from the arithmetic mean of the gradients $S_1$, the median value or the like.

It is also advantageous to determine a large number of gradients $S_1$ or degrees of change by means of a large number of measurements over the course of the time during which the storage battery has been in use. The relative change in the amount of charge $Q_R$ which can be drawn can be determined from the trend in the degrees of change S, that is to say the relative change in the degrees of change S. This change can be used to deduce the wear to the storage battery, in particular the decrease in the amount of charge which can be stored.

To do this, a degree of change $S_{new}$ which is characteristic of a battery state with the new energy storage capacity $K_{new}$ is preferably determined using the method described above for a new battery. After a specific learning phase, whose end can be defined, for example, by the passing of a specific number of operating hours or a specific time since the energy store was first used, the process of learning the degree of change $S_{new}$ which is characteristic of the new storage battery is ended. The subsequently determined degrees of change S are then compared with the characteristic degree of change characteristic value $S_{new}$, and the present energy storage capacity K is determined from the product of the energy storage capacity $K_{new}$ of the storage battery in the new state and a function of the present degree of change S and of the characteristic degree of change characteristic value $S_{new}$:

$$K = K_{new} * f(S/S_{new}).$$

By way of example, the present energy storage capacity K can be determined relatively easily directly by means of the equation:

$$K = K_{new} * S_{new}/S$$

where $K_{new}$ is the energy storage capacity of the storage battery in the new state (i.e., the rated storage capacity).

Instead of a large number of individual current pulses i(t), it is also possible to use a galvanic double pulse with a change in the mathematical sign of the current flow in order to determine a degree of change S. This method has the advantage that the net state of charge remains unchanged and less energy is required overall to stimulate the storage battery if the amount of energy which is drawn from the storage battery in the discharge half-cycle is used in the charging half-cycle.

Figure 3:
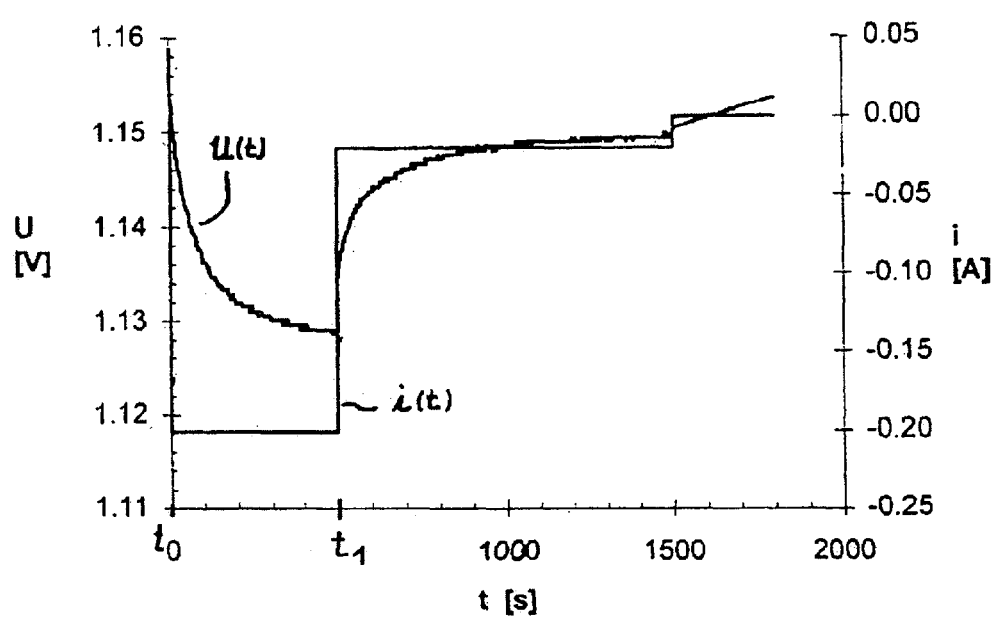
FIG. 3 shows a diagram of a voltage response signal profile to a galvanic double-current pulse.

FIG. 3 shows a diagram of a voltage response signal profile to a galvanostatic double-current pulse for stimulation of the storage battery.

The sketched response signal profiles in the two time intervals $\Delta t_1$ (from time $t_0$ to time $t_1$) and $\Delta t_2$ (from time $t_1$ to time 1500 seconds) of the double-current pulse are in each case linearized and are used to determine the gradients $S_1$ with the degree of change S being calculated from the averaged gradients $S_1$.

The storage battery is preferably stimulated under the control of a controller by applying a current profile i(t) with largely square flanks, as can be seen in FIGS. 1 and 3. This is preferably done during phases of operation in which no electrical load, or in any case only a small electrical load is otherwise produced by other components. In the case of a motor vehicle by way of example, this is a phase during which the vehicle is parked, in which the residual current load in the discharge direction is normally about 10 to 100 mA, which is also caused by loads that are operated when the vehicle is at rest. The controller may itself product the current profile i(t). However, it is also feasible for other current loads or current sources to be operated in such a way that the desired current profile i(t) is produced for the storage battery. By way of example, a further energy store can also be used as a current load and/or as a current source, if appropriate coupled via a DC/DC converter, for stimulation of the storage battery.

Instead of a square-wave current profile i(t), it is also possible to apply a current profile with a different waveform, for example using a function generator. In the same way, a function generator, for example, can be used to apply a voltage profile U(t) instead of a current profile i(t), with the voltage response being evaluated.

Instead of the described evaluation of the gradient $S_1$ of the response signal profile in the time period, it is also possible to determine the gradient $S_1$ of the response signal profile in the impedance domain. For this purpose, the gradient $S_1$ of the Warburg straight line Z is considered against the square root of the frequency. In contrast to the method described in EP 0 516 336 B1, a search is thus carried out for the gradient of the Warburg straight line, rather than for the radio-frequency intersection point, and this is evaluated. However, in this case, the storage battery is stimulated in the same way as in the methods described in EP 0 516 336 B1.

It is important to note that the construction and arrangement of the elements of the embodiments shown and described in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. It should be noted that the elements and/or assemblies of the system may be constructed from any of a wide variety of materials that provide sufficient strength or durability. Other substitutions, modifications, changes and omissions may be made in the design, operating conditions and arrangement of the preferred and other exemplary embodiments without departing from the scope of the present invention.

What is claimed is:

1. A method for determining the amount of charge which can be drawn from a storage battery, the method comprising:
   determining a response signal profile within a time interval to an electrical stimulus to the storage battery;
   linearizing the response signal profile; and
   determining the amount of charge which can be drawn as a function of a degree of change of the linearized response signal profile in the time interval.

2. The method of claim 1 wherein the response signal profile is a voltage response to a pulsed current stimulus to the storage battery.

3. The method of claim 2 wherein the degree of change is related to the magnitude of a sudden current change in the pulsed current stimulus.

4. The method of claim 1 wherein the response signal profile is a current response to a pulsed voltage stimulus to the storage battery.

5. The method of claim 4 wherein the degree of change is related to the magnitude of a sudden voltage change in the pulsed voltage stimulus.

6. The method of claim 1 further comprising determining the amount of charge which can be drawn utilizing a function or a value table.

7. The method of claim 1 further comprising:
determining a regression straight line by the linearized response signal profile; and
determining a gradient of the regression straight line to determine the degree of change.

8. The method of claim 7 wherein the amount of charge which can be drawn has a response that is inversely proportional to the gradient of the regression straight line.

9. The method of claim 8 wherein the amount of charge which can be drawn is determined from the product of a rated capacity of the storage battery and a function of the degree of change and a characteristic degree of change characteristic value for the storage battery.

10. The method of claim 9 wherein the amount of charge which can be drawn is determined from a product of the rated capacity of the storage battery and a function of the quotient between the degree of change and a characteristic degree of change characteristic value for the storage battery.

11. The method of claim 10 wherein the amount of charge which can be drawn is determined using the formula:

$$Q_R = \text{Rated capacity} \cdot S_{new}/S$$

where $S_{new}$ is a characteristic degree of change characteristic value and S is a present degree of change.

12. The method of claim 1 wherein the step of linearizing the response signal profile comprises evaluating the response signal profile as a function of the square root of a time difference between a start time of the time interval and the time.

13. The method of claim 1 further comprising:
applying a sequence of current pulses or voltage pulses to the storage battery, each of the pulses providing a response signal profile;
determining the degrees of change for each of the response signal profiles of the individual current pulses or voltage pulses; and
determining the amount of charge which can be drawn as a function of the determined degrees of change.

14. The method of claim 1 further comprising:
determining the degrees of change of linearized response signal profiles repeatedly throughout the time during which the storage battery is in use;
determining the relative change in the amount of charge which can be drawn as a function of the relative change in the determined degrees of change; and
determining a measure for the wear to the storage battery from the relative change.

15. The method of claim 1 further comprising:
determining the amount of charge which can be drawn as a function of the degree of change related to a degree of change characteristic value which is characteristic of the storage battery in a new state.

16. The method of claim 7 further comprising:
determining the present energy storage capacity of the storage battery as a measure of the amount of charge which can be drawn, with the present energy storage capacity having a response that is inversely proportional to the gradient of the regression straight line.

17. The method of claim 16 wherein the present energy storage capacity is determined from the product of the storage capacity of the storage battery in a new state and a function of the present degree of change and a characteristic degree of change characteristic value.

18. The method of claim 17 wherein the present energy storage capacity is determined from the product of the storage capacity of the storage battery in the new state and a function of the quotient between the present degree of change and the characteristic degree of change characteristic value.

19. The method of claim 18 wherein the present energy storage capacity is determined using the formula:

$$K = K_{new} \cdot S_{new}/S$$

where $K_{new}$ is the storage capacity of the storage battery in the new state, $S_{new}$ is the characteristic degree of change characteristic value and S is the present degree of change.

20. The method of claim 1 further comprising determining the degrees of change for a new storage battery repeatedly over a defined time to determine a characteristic degree of change characteristic value from the determined degrees of change.

21. The method of claim 20 further comprising determining the degrees of change for comparable states of charge and temperatures of the storage battery.

22. The method of claim 21 further comprising determining the amount of charge which can be drawn as a function of storage battery temperature.

23. The method of claim 22 further comprising normalizing the degrees of change to a nominal temperature.

24. The method of claim 2 wherein the magnitude of current values of the pulsed current stimulus corresponds at most to a 10-hour current of the storage battery.

25. The method of claim 2 wherein the magnitude of current values of the pulsed current stimulus corresponds at most to a 50-hour current of the storage battery.

26. The method of claim 2 wherein the magnitude of current values of the pulsed current stimulus corresponds at most to a 200-hour current of the storage battery.

27. The method of claim 2 wherein a current change in the pulsed current stimulus is carried out with a current rate of change whose magnitude is at least in the same order of magnitude as a quotient of the 5000-hour current per second.

28. The method of claim 2 wherein a current change in the pulsed current stimulus is carried out with a current rate of change whose magnitude is at least in the same order of magnitude as a quotient of the 1000-hour current per second.

29. The method of claim 2 wherein a current change in the pulsed current stimulus is carried out with a current rate of change whose magnitude is at least in the same order of magnitude as a quotient of the 200-hour current per second.

30. The method of claim 1 wherein the degree of change is determined only from that section of the response signal profile which was measured at the earliest one second after the stimulus.

31. The method of claim 1 wherein the degree of change is determined only from that section of the response signal profile which was measured at the earliest 10 seconds after the stimulus.

32. The method of claim 1 wherein the degree of change is determined only from that section of the response signal profile which was measured at the latest 1000 seconds after the stimulus.

33. The method of claim 1 wherein the degree of change is determined only from that section of the response signal profile which was measured at the latest 100 seconds after the stimulus.

34. The method of claim 1 wherein the only values of the response signal profile which are used for linearization are those which satisfy a defined determination measure.

35. The method of claim 2 wherein the pulsed current stimulus is applied to the storage battery by means of an electrical switching unit.

36. The method of claim 1 further comprising linking the determined amount of charge which can be drawn to at least one other battery state variable to determine the amount of charge with which the storage battery can be charged.

37. The method of claim 36 wherein the at least one other battery state variable is selected from a present degree of discharge and a present state of charge.

38. The method of claim 36 further comprising comparing at least one of the determined amount of charge which can be drawn, the degree of charge, the amount of charge with which the storage battery can be charged, and the energy storage capacity of the storage battery as a comparison variable with a defined threshold value, and outputting the discrepancy or the ratio of the comparison variable to the threshold value.

39. The method of claim 38 wherein the threshold value is temperature-dependent.

40. The method of claim 1 further comprising determining the present storage capacity of the storage battery from the determined amount of charge which can be drawn and linking the present storage capacity to the storage capacity of the storage battery in a new state to determine a measure for the reduction in storage capacity.

41. The method of claim 40 further comprising comparing the determined measure for the reduction in the storage capacity with a defined threshold value.

42. A monitoring device for a storage battery comprising:

measurement means for measuring at least one of voltage and current of the storage battery over time intervals; and evaluation means;

wherein the evaluation means are designed for carrying out a method comprising:
determining a response signal profile within a time interval to an electrical stimulus to the storage battery,
linearizing the response signal profile; and
determining the amount of charge which can be drawn as a function of a degree of change of the line arized response signal profile in the time interval.

* * * * *